United States Patent
Chen et al.

(10) Patent No.: US 9,432,001 B2
(45) Date of Patent: Aug. 30, 2016

(54) SIGNAL GENERATOR AND CALIBRATING METHOD THEREOF

(71) Applicant: MediaTek Inc., Hsin-Chu (TW)

(72) Inventors: Yi-Feng Chen, Xinpu Township, Hsinchu County (TW); Tsung-Ying Tsai, Zhubei (TW); Heng-Meng Liu, Jhubei (TW); Sung-Yun Hsueh, Yuli Township, Hualien County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/881,505

(22) Filed: Oct. 13, 2015

(65) Prior Publication Data

US 2016/0156360 A1     Jun. 2, 2016

Related U.S. Application Data

(60) Provisional application No. 62/085,357, filed on Nov. 28, 2014.

(51) Int. Cl.
*H03K 3/03*     (2006.01)
*H03L 7/00*     (2006.01)

(52) U.S. Cl.
CPC ............... *H03K 3/0315* (2013.01); *H03L 7/00* (2013.01)

(58) Field of Classification Search
CPC ..................... H03K 3/0315; H03L 7/0995
USPC ................................................. 331/57
See application file for complete search history.

(56) References Cited

U.S. PATENT DOCUMENTS

| | | | |
|---|---|---|---|
| 6,590,458 B2 * | 7/2003 | Rombach | H03K 3/0315 327/156 |
| 7,151,417 B1 * | 12/2006 | Suzuki | G01R 31/2884 331/185 |
| 7,355,482 B2 * | 4/2008 | Meltzer | H03K 5/133 331/10 |
| 8,508,304 B2 * | 8/2013 | Ravinuthula | H03K 3/013 331/175 |
| 2014/0176116 A1 * | 6/2014 | Kumar | G01R 31/2858 324/76.41 |

* cited by examiner

*Primary Examiner* — Ryan Johnson
(74) *Attorney, Agent, or Firm* — McClure, Qualey & Rodack, LLP

(57) ABSTRACT

A signal generator includes a main ring oscillator and a first ring oscillator. The main ring oscillator is supplied by a power voltage, and is configured to generate an output oscillation signal. The main ring oscillator is coupled through a power mesh to the power voltage. The first ring oscillator is supplied by the power voltage. The first ring oscillator is similar or identical to the main ring oscillator. The first ring oscillator is coupled through the power mesh to the power voltage. The first ring oscillator is used to calibrate a frequency of the output oscillation signal.

22 Claims, 5 Drawing Sheets

SIGNAL GENERATOR AND CALIBRATING METHOD THEREOF

CROSS REFERENCE TO RELATED APPLICATIONS

This application claims the benefit of U.S. Provisional Application No. 62/085,357, filed on Nov. 28, 2014, the entirety of which is incorporated by reference herein.

BACKGROUND OF THE INVENTION

1. Field of the Invention

The disclosure generally relates to a signal generator, and more specifically, to a signal generator with a function of frequency calibration.

2. Description of the Related Art

Signal generators are commonly used in the field of digital circuits. For example, a signal generator may be configured to generate a clock signal for driving a variety of circuit elements, and its clock frequency should be very accurate. As a matter of fact, the clock frequency is often negatively affected by a normal IR-drop in the circuit. The so-called IR-drop represents that the supply voltage of the signal generator is decreased because of imperfect conductor lines, and the IR-drop results in a lower supply voltage and a lower clock frequency, which degrade the performance of the signal generator. Hence, there is a need to design a novel signal generator for solving the problem of the prior art.

BRIEF SUMMARY OF THE INVENTION

In one exemplary embodiment, the disclosure is directed to a signal generator including a main ring oscillator and a first ring oscillator. The main ring oscillator is supplied by a power voltage, and is configured to generate an output oscillation signal. The main ring oscillator is coupled through a power mesh to the power voltage. The first ring oscillator is supplied by the power voltage. The first ring oscillator is similar or identical to the main ring oscillator. The first ring oscillator is coupled through the power mesh to the power voltage. The first ring oscillator is used to calibrate a frequency of the output oscillation signal.

In some embodiments, the power mesh has a resistance, and the frequency of the output oscillation signal is decreased because of the resistance of the power mesh.

In some embodiments, the frequency of the output oscillation signal is calibrated according to a first calibration data from the first ring oscillator.

In some embodiments, the first calibration data is obtained by selectively disabling and enabling the first ring oscillator.

In some embodiments, the first calibration data includes a first frequency and a second frequency, the first frequency is the frequency of the output oscillation signal which is recorded when the first ring oscillator is disabled, and the second frequency is the frequency of the output oscillation signal which is recorded when the first ring oscillator is enabled.

In some embodiments, the signal generator further includes a processor. The processor performs a regression analysis for the first frequency and the second frequency so as to calculate a correct frequency of the output oscillation signal.

In some embodiments, the correct frequency is calculated as follows: $FC=2 \times F1-F2$, where FC represents the correct frequency, F1 represents the first frequency, and F2 represents the second frequency.

In some embodiments, the signal generator further includes a second ring oscillator. The second ring oscillator is supplied by the power voltage. The second ring oscillator is similar or identical to the main ring oscillator. The second ring oscillator is coupled through the power mesh to the power voltage. The second ring oscillator is used to calibrate the frequency of the main ring oscillator.

In some embodiments, the main ring oscillator includes an NAND gate, a first inverter, and a second inverter. The NAND gate has a first input terminal for receiving an enable signal, a second input terminal, and an output terminal. The first inverter has an input terminal coupled to the output terminal of the NAND gate, and an output terminal. The second inverter has an input terminal coupled to the output terminal of the first inverter, and an output terminal coupled to the second input terminal of the NAND gate. The output terminal of the second inverter is arranged for outputting the output oscillation signal.

In some embodiments, the resistance of the power mesh is from about 100Ω to about 200Ω.

In one exemplary embodiment, the disclosure is directed to a method for calibrating a signal generator. The method includes the steps of: providing a main ring oscillator which is supplied by a power voltage, wherein the main ring oscillator is configured to generate an output oscillation signal, and wherein the main ring oscillator is coupled through a power mesh to the power voltage; providing a first ring oscillator which is supplied by the power voltage, wherein the first ring oscillator is similar or identical to the main ring oscillator, and wherein the first ring oscillator is coupled through the power mesh to the power voltage; and using the first ring oscillator to calibrate a frequency of the output oscillation signal.

In some embodiments, the first ring oscillator includes an NAND gate, a first inverter, and a second inverter. The NAND gate has a first input terminal for receiving a first control signal, a second input terminal, and an output terminal. The first inverter has an input terminal coupled to the output terminal of the NAND gate, and an output terminal. The second inverter has an input terminal coupled to the output terminal of the first inverter, and an output terminal coupled to the second input terminal of the NAND gate.

In some embodiments, the second ring oscillator includes an NAND gate, a first inverter, and a second inverter. The NAND gate has a first input terminal for receiving a second control signal, a second input terminal, and an output terminal. The first inverter has an input terminal coupled to the output terminal of the NAND gate, and an output terminal. The second inverter has an input terminal coupled to the output terminal of the first inverter, and an output terminal coupled to the second input terminal of the NAND gate.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 1:
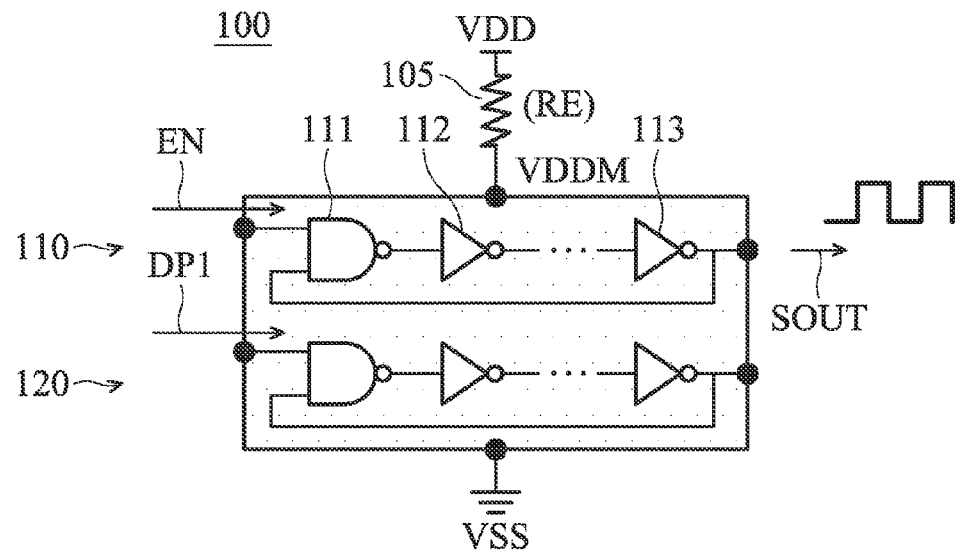
FIG. 1 is a diagram of a signal generator according to an embodiment of the invention.

FIG. 1 is a diagram of a signal generator 100 according to an embodiment of the invention. The signal generator 100 may be a clock generator for use in digital circuits. As shown in FIG. 1, the signal generator 100 includes a main ring oscillator 110 and a first ring oscillator 120. The main ring oscillator 110 is supplied by a power voltage VDD, and is configured to generate an output oscillation signal SOUT for driving a variety of circuit elements. The output oscillation signal SOUT may be a clock signal, such as a square wave or a triangular wave. The main ring oscillator 110 is coupled through a power mesh 105 to the power voltage VDD. More specifically, the main ring oscillator 110 may include a plurality of oscillation elements, such as inverters, NAND gates, and/or NOR gates. The power mesh 105 may include a plurality of conductive lines (not shown), each of which is configured to electrically couple a respective oscillation element of the main ring oscillator 110 to the power voltage VDD. In an ideal case, the power mesh 105 is a perfect conductor with zero resistance, and the frequency of the output oscillation signal SOUT from the main ring oscillator 110 is accurate. However, for practical applications, the power mesh 105 has a resistance (e.g., the resistance may be from about 100Ω to about 200Ω), and the frequency of the output oscillation signal SOUT is decreased because of the resistance of the power mesh 105. More specifically, the resistance of the power mesh 105 may cause an IR-drop, which results in a lower supply voltage VDDM and a lower clock frequency. For example, the original output clock frequency may be from about 800 MHz to about 1200 MHz, and the decreased output clock frequency due to the resistance of the power mesh 105 may be from about 760 MHz to about 1140 MHz. In the invention, the first ring oscillator 120 is added and used to calibrate the frequency of the output oscillation signal SOUT. Preferably, the first ring oscillator 120 is similar or identical to the main ring oscillator 110, so as to simulate the characteristics of the main ring oscillator 110. The first ring oscillator 120 is also supplied by the power voltage VDD, and is also coupled through the power mesh 105 to the power voltage VDD. It should be understood that the inner structures of the main ring oscillator 110 and the first ring oscillator 120, as shown in the figures, are just exemplary, rather than limitations of the invention. The invention may be implemented with a variety of ring oscillators. The detailed structures and operations of the signal generator 100 will be illustrated in the following embodiments.

In the embodiment of FIG. 1, the main ring oscillator 110 at least includes an NAND gate 111, a first inverter 112, and a second inverter 113. In alternative embodiments, the NAND gate 111 is replaced with an NOR gate. The NAND gate 111 has a first input terminal for receiving an enable signal EN, a second input terminal, and an output terminal. The first inverter 112 has an input terminal coupled to the output terminal of the NAND gate 111, and an output terminal. The second inverter 113 has an input terminal coupled to the output terminal of the first inverter 112, and an output terminal coupled to the second input terminal of the NAND gate 111. The output terminal of the second inverter 113 is arranged for outputting the output oscillation signal SOUT. If the enable signal EN has a high logic level (i.e., a logic "1"), the main ring oscillator 110 will be enabled and keep oscillating, and if the enable signal EN has a low logic level (i.e., a logic "0"), the main ring oscillator 110 will be disabled and stop oscillating. The first ring oscillator 120 is similar to the main ring oscillator 110. The first ring oscillator 120 also at least includes an NAND gate, a first inverter, and a second inverter. The difference between the main ring oscillator 110 and the first ring oscillator 120 is that the NAND gate of the first ring oscillator 120 has a first input terminal for receiving a first control signal DP1, rather than the enable signal EN. If the first control signal DP1 has a high logic level, the first ring oscillator 120 will be enabled and keep oscillating, and if the first control signal DP1 has a low logic level, the first ring oscillator 120 will be disabled and stop oscillating. Therefore, the enabled and disabled states of the main ring oscillator 110 and the first ring oscillator 120 may be determined by controlling the enable signal EN and the first control signal DP1. It should be understood that the number of inverters of the above ring oscillators of FIG. 1 is not limited, and each of the main ring oscillator 110 and the first ring oscillator 120 may include one NAND gate and any even number of inverters (e.g., 2, 4, 6, 8, or 10 inverters).

Figure 2:
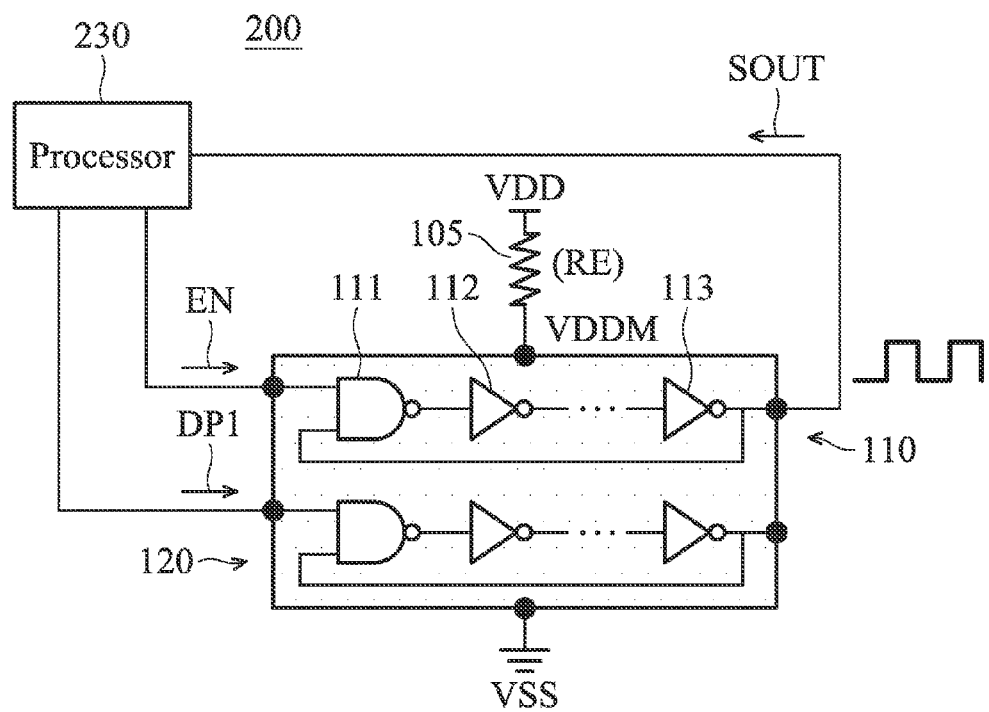
FIG. 2 is a diagram of a signal generator according to an embodiment of the invention.

FIG. 2 is a diagram of a signal generator 200 according to an embodiment of the invention. FIG. 2 is similar to FIG. 1. The difference between the two embodiments is that the signal generator 200 further includes a processor 230. The processor 230 may be configured to monitor the output of the main ring oscillator 110, control the inputs of the main ring oscillator 110 and the first ring oscillator 120, and calibrate the frequency of the output oscillation signal SOUT. The processor 230 may be integrated with the signal generator 200, or may be an external element which is independent of the signal generator 200. The above enable signal EN and first control signal DP1 may be generated by the processor 230, and the above output oscillation signal SOUT may be monitored by the processor 230. In order to obtain the accurate output clock frequency, the frequency of the output oscillation signal SOUT may be calibrated according to a first calibration data from the first ring oscillator 120. The first calibration data is obtained by selectively disabling and enabling the first ring oscillator 120. In some embodiments, the first calibration data includes a first frequency F1 and a second frequency F2. The first frequency F1 is the frequency of the output oscillation signal SOUT which is recorded when the first ring oscillator 120 is disabled. The second frequency F2 is the frequency of the output oscillation signal SOUT which is recorded when the first ring oscillator 120 is enabled.

Figure 3:
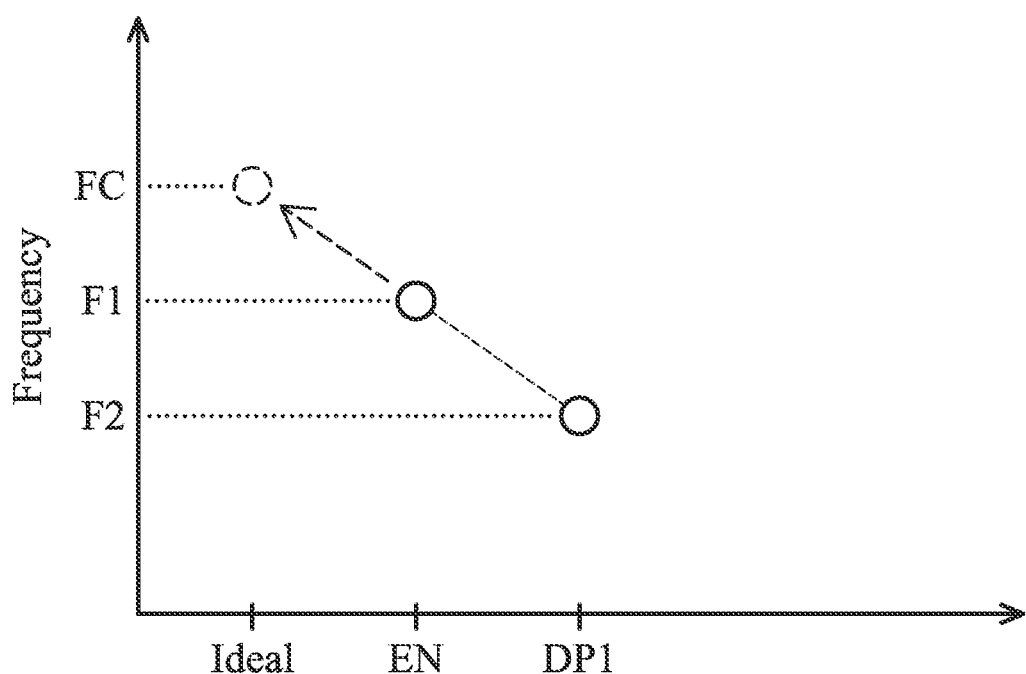
FIG. 3 is a diagram of the relationship between the frequency of an output oscillation signal and the operation state of a first ring oscillator according to an embodiment of the invention.

FIG. 3 is a diagram of the relationship between the frequency of the output oscillation signal SOUT and the operation state of the first ring oscillator 120 according to an embodiment of the invention. The main ring oscillator 110 is always enabled to generate the output oscillation signal SOUT. The first ring oscillator 120 is selectively disabled and enabled. When the first ring oscillator 120 is disabled (i.e., the operation state "EN" on the horizontal axis), the corresponding frequency of the output oscillation signal SOUT is the first frequency F1. When the first ring oscillator 120 is enabled (i.e., the operation state "DP1" on the horizontal axis), the corresponding frequency of the output oscillation signal SOUT is the second frequency F2. In other words, if more ring oscillators are enabled, the current flowing through the power mesh 105 will become higher, and it may result in a serious IR-drop, a lower supply voltage VDDM, and a lower output clock frequency. As a result, the second frequency F2 must be lower than the first frequency F1.

For practical applications, the IR-drop exists whenever the main ring oscillator 110 is used, and therefore a conventional ring oscillator cannot provide an accurate output clock frequency. The invention proposes to add the first ring oscillator 120 to overcome the drawback of the conventional design. In a preferred embodiment, the processor 230 can control the operation states of first ring oscillator 120 and perform a regression analysis, so as to estimate the correct frequency of the output oscillation signal SOUT of the main ring oscillator 110. This frequency calibration procedure will be described in detailed as follows.

In the embodiments of FIGS. 2 and 3, the processor 230 can perform a regression analysis for the first frequency F1 and the second frequency F2 so as to calculate a correct frequency FC of the output oscillation signal SOUT. The correct frequency FC may represent an ideal oscillation case, in which no IR-drop exists and the output clock frequency of the main ring oscillator 110 is accurate. The first frequency F1 may represent a first oscillation case, in which one amount of IR-drop exists. The second frequency F2 may represent a second oscillation case, in which two amounts of IR-drop exist. Therefore, according to the regression analysis, the first frequency F1 can be an average of the correct frequency FC and the second frequency F2. The relationship between the first frequency F1, the second frequency F2, and the correct frequency FC may be estimated in the equation (1):

$$F1 = \frac{FC + F2}{2} \quad (1)$$

Furthermore, the equation (1) is derived to the equation (2):

$$FC = 2 \times F1 - F2 \quad (2)$$

where FC represents the correct frequency, F1 represents the first frequency, and F2 represents the second frequency.

The processor 230 can control the enabled and disabled states of the first ring oscillator 120, record each corresponding frequency of the output oscillation signal SOUT, and finally calculate the correct output clock frequency of the main ring oscillator 110, so as to complete the aforementioned frequency calibration procedure. It should be understood that the above regression analysis is simply estimated with a straight line. However, the invention is not limited thereto. In alternative embodiments, more frequency samples may be retrieved for a higher-order regression analysis, they will be illustrated in the following embodiments of FIGS. 4 and 5.

Figure 4:
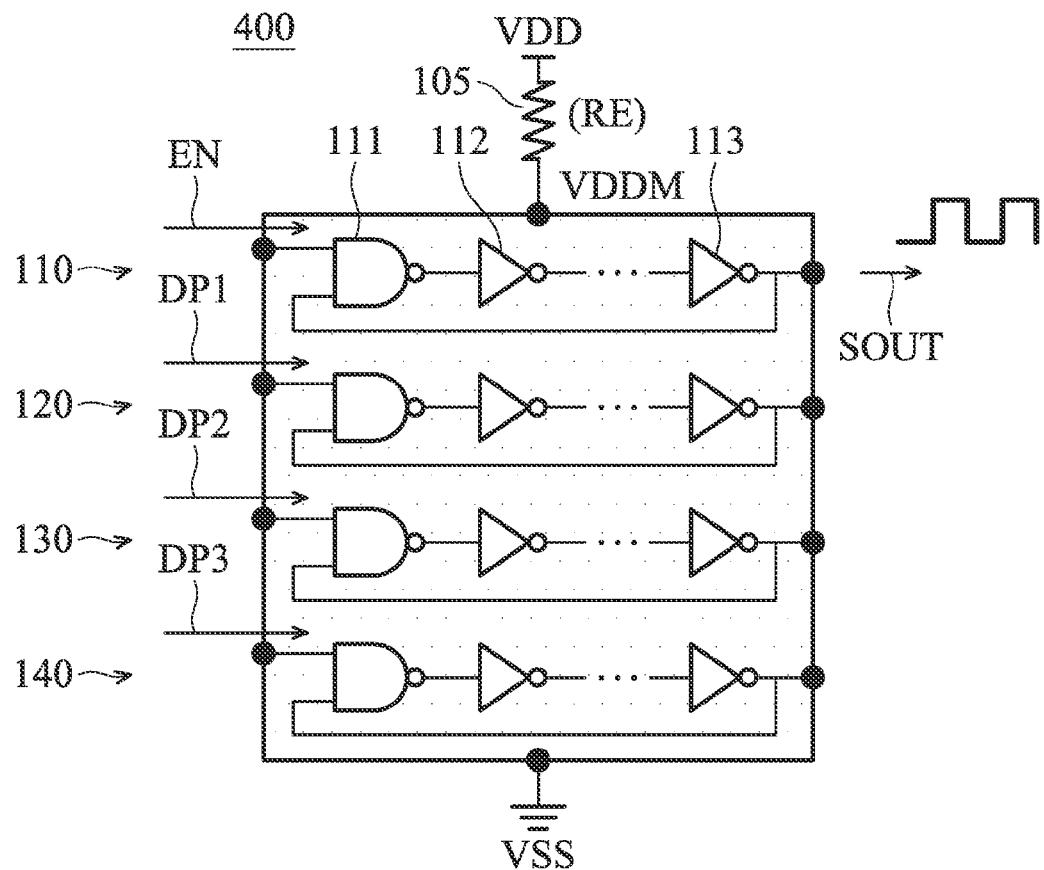
FIG. 4 is a diagram of a signal generator according to an embodiment of the invention.

FIG. 4 is a diagram of a signal generator 400 according to an embodiment of the invention. FIG. 4 is similar to FIG. 1. The difference between the two embodiments is that the signal generator 400 further includes a second ring oscillator 130 and/or a third ring oscillator 140. The number of ring oscillators (including the main ring oscillator 110) is not limited. For example, the signal generator 400 may include two or more ring oscillators (e.g., 2, 3, 4, 5, 6, or 7 ring oscillators). The second ring oscillator 130 and the third ring oscillator 140 are both supplied by the power voltage VDD, and both are coupled through the power mesh 105 to the power voltage VDD. Each of the second ring oscillator 130 and the third ring oscillator 140 is similar or identical to the main ring oscillator 110. That is, each of the second ring oscillator 130 and the third ring oscillator 140 at least includes an NAND gate, a first inverter, and a second inverter. In alternative embodiments, the NAND gate is replaced with an NOR gate. The difference between the second ring oscillator 130, the third ring oscillator 140, and the main ring oscillator 110 is that the NAND gate of the second ring oscillator 130 has a first input terminal for receiving a second control signal DP2, and the NAND gate of the third ring oscillator 140 has a first input terminal for receiving a third control signal DP3. Similarly, in order to obtain the accurate output clock frequency, the frequency of the output oscillation signal SOUT may be calibrated according to a first calibration data from the first ring oscillator 120, a second calibration data from the second ring oscillator 130, and a third calibration data from the third ring oscillator 140. Each calibration data may be obtained by disabling and enabling a respective one of the first ring oscillator 120, the second ring oscillator 130, and the third ring oscillator 140, as described in the embodiments of FIGS. 2 and 3.

Figure 5:
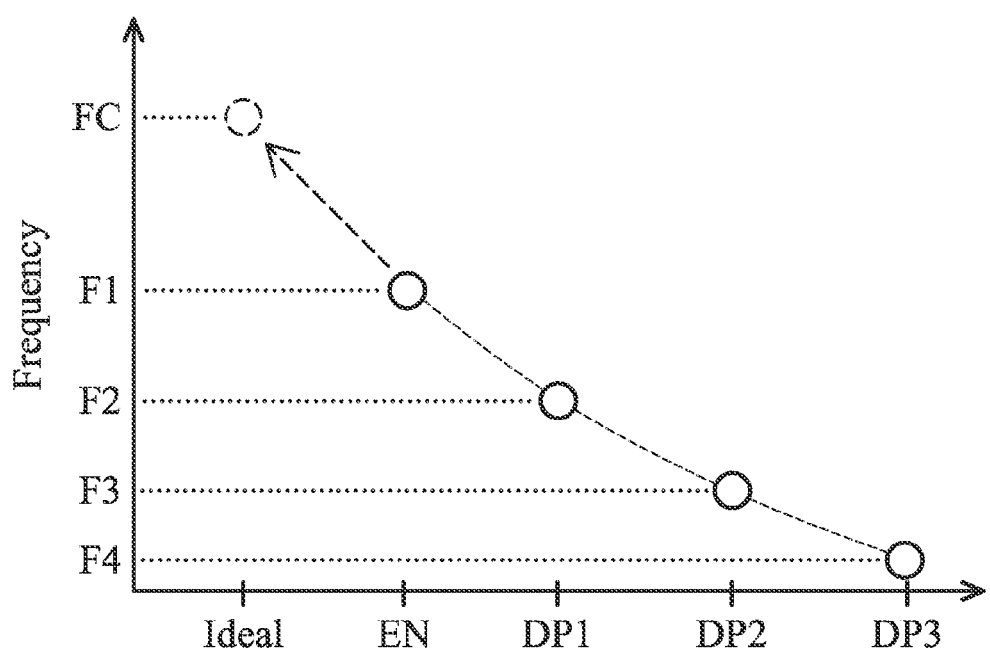
FIG. 5 is a diagram of the relationship between the frequency of an output oscillation signal and the operation states of a first ring oscillator, a second ring oscillator, and a third ring oscillator according to an embodiment of the invention.

FIG. 5 is a diagram of the relationship between the frequency of the output oscillation signal SOUT and the operation states of the first ring oscillator 120, the second ring oscillator 130, and the third ring oscillator 140 according to an embodiment of the invention. The main ring oscillator 110 is always enabled to generate the output oscillation signal SOUT. The first ring oscillator 120, the second ring oscillator 130, and the third ring oscillator 140 are selectively disabled and enabled. When the first ring oscillator 120, the second ring oscillator 130, and the third ring oscillator 140 are all disabled (i.e., the operation state "EN" on the horizontal axis), the corresponding frequency of the output oscillation signal SOUT is the first frequency F1. When the first ring oscillator 120 is enabled, and the second ring oscillator 130 and the third ring oscillator 140 are both disabled (i.e., the operation state "DP1" on the horizontal axis), the corresponding frequency of the output oscillation signal SOUT is the second frequency F2. When the first ring oscillator 120 and the second ring oscillator 130 are both enabled, and the third ring oscillator 140 is disabled (i.e., the operation state "DP2" on the horizontal axis), the corresponding frequency of the output oscillation signal SOUT is a third frequency F3. When the first ring oscillator 120, the second ring oscillator 130, and the third ring oscillator 140 are all enabled (i.e., the operation state "DP3" on the horizontal axis), the corresponding frequency of the output oscillation signal SOUT is a fourth frequency F4. A processor (not shown) of the signal generator 400 can perform a regression analysis for the first frequency F1, the second frequency F2, the third frequency F3, and the fourth frequency F4, so as to calculate a correct frequency FC of the output oscillation signal SOUT and complete the frequency calibration procedure. In some embodiments, a curve fitting method is used for the regression analysis. For example, the method of extrapolation may be applied to the above four frequency samples. In addition to estimation with a straight line, a quadratic curve, a cubic curve, or other higher-order curves may be used to estimate the correct frequency FC, according to the first frequency F1, the second frequency F2, the third frequency F3, and the fourth frequency F4. Generally, with more frequency samples obtained, the accuracy of the estimated correct frequency FC can be significantly improved.

Figure 6:
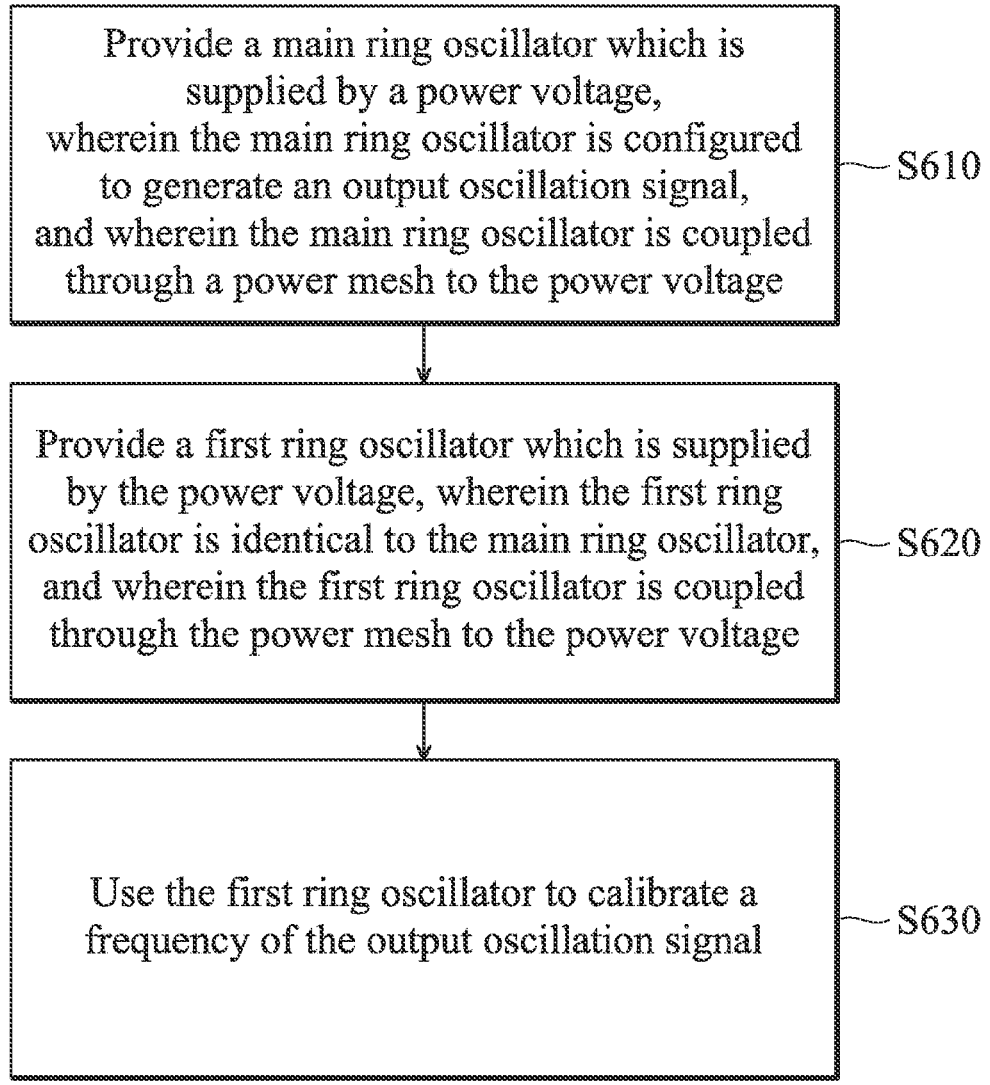
FIG. 6 is a flowchart of a method for calibrating a signal generator according to an embodiment of the invention.

FIG. 6 is a flowchart of a method for calibrating a signal generator according to an embodiment of the invention. In step S610, a main ring oscillator which is supplied by a power voltage is provided. The main ring oscillator is configured to generate an output oscillation signal, and is coupled through a power mesh to the power voltage. In step S620, a first ring oscillator which is supplied by the power voltage is provided. The first ring oscillator is similar or identical to the main ring oscillator, and is coupled through the power mesh to the power voltage. In step S630, the first ring oscillator is used to calibrate a frequency of the output oscillation signal. It should be understood that the above steps are not required to be performed sequentially, and any one or more features of the embodiments of FIGS. 1 to 5 may be applied to the method of FIG. 6.

The problem of IR-drop often exists in a variety of signal generators with power meshes, and it is unavoidable and tends to cause inaccurate output clock frequency, thereby degrading the performance of signal generators. The invention provides a device and a method for calibrating the output clock frequency of a signal generator. In comparison to the conventional design, the invention has at least the advantages of low cost, simple circuit structure, and self-calibration, and it can effectively solve the problem of the prior art.

The above parameters are just exemplary, rather than limitations of the invention. One of ordinary skill may adjust these settings according to different requirements. It should be understood that the proposed device and method are not limited to the configurations and flowcharts of FIGS. 1 to 6. The invention may merely include any one or more features of any one or more embodiments of FIGS. 1 to 6. In other words, not all of the features shown in the figures should be implemented in the device and method of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal generator, comprising:
a main ring oscillator, supplied by a power voltage, and configured to generate an output oscillation signal, wherein the main ring oscillator is coupled through a power mesh to the power voltage;
a first ring oscillator, supplied by the power voltage, wherein the first ring oscillator is similar or identical to the main ring oscillator, and wherein the first ring oscillator is coupled through the power mesh to the power voltage; and
a second ring oscillator, supplied by the power voltage, wherein the second ring oscillator is similar or identical to the main ring oscillator, and wherein the second ring oscillator is coupled through the power mesh to the power voltage;
wherein the first ring oscillator is used to calibrate a frequency of the output oscillation signal;
wherein the second ring oscillator is used to calibrate the frequency of the main ring oscillator.

2. The signal generator as claimed in claim 1, wherein the power mesh has a resistance, and the frequency of the output oscillation signal is decreased because of the resistance of the power mesh.

3. The signal generator as claimed in claim 2, wherein the frequency of the output oscillation signal is calibrated according to a first calibration data which is based on an oscillation frequency of the first ring oscillator.

4. The signal generator as claimed in claim 3, wherein the first calibration data is obtained by selectively disabling and enabling the first ring oscillator.

5. The signal generator as claimed in claim 4, wherein the first calibration data comprises a first frequency and a second frequency, the first frequency is the frequency of the output oscillation signal which is recorded when the first ring oscillator is disabled, and the second frequency is the frequency of the output oscillation signal which is recorded when the first ring oscillator is enabled.

6. The signal generator as claimed in claim 5, further comprising:
a processor, performing a regression analysis for the first frequency and the second frequency so as to calculate a correct frequency of the output oscillation signal.

7. The signal generator as claimed in claim 6, wherein the correct frequency is calculated as follows:

$$FC=2\times F1-F2$$

wherein FC represents the correct frequency, F1 represents the first frequency, and F2 represents the second frequency.

8. The signal generator as claimed in claim 1, wherein the main ring oscillator comprises:
an NAND gate, wherein the NAND gate has a first input terminal for receiving an enable signal, a second input terminal, and an output terminal;
a first inverter, wherein the first inverter has an input terminal coupled to the output terminal of the NAND gate, and an output terminal; and
a second inverter, wherein the second inverter has an input terminal coupled to the output terminal of the first inverter, and an output terminal coupled to the second input terminal of the NAND gate;
wherein the output terminal of the second inverter is arranged for outputting the output oscillation signal.

9. The signal generator as claimed in claim 1, wherein the first ring oscillator comprises:
an NAND gate, wherein the NAND gate has a first input terminal for receiving a first control signal, a second input terminal, and an output terminal;
a first inverter, wherein the first inverter has an input terminal coupled to the output terminal of the NAND gate, and an output terminal; and
a second inverter, wherein the second inverter has an input terminal coupled to the output terminal of the first inverter, and an output terminal coupled to the second input terminal of the NAND gate.

10. The signal generator as claimed in claim 1, wherein the second ring oscillator comprises:

an NAND gate, wherein the NAND gate has a first input terminal for receiving a second control signal, a second input terminal, and an output terminal;

a first inverter, wherein the first inverter has an input terminal coupled to the output terminal of the NAND gate, and an output terminal; and a second inverter, wherein the second inverter has an input terminal coupled to the output terminal of the first inverter, and an output terminal coupled to the second input terminal of the NAND gate.

11. The signal generator as claimed in claim 2, wherein the resistance of the power mesh is from 100Ω to 200Ω.

12. A method for calibrating a signal generator, comprising the steps of:

providing a main ring oscillator which is supplied by a power voltage, wherein the main ring oscillator is configured to generate an output oscillation signal, and wherein the main ring oscillator is coupled through a power mesh to the power voltage;

providing a first ring oscillator which is supplied by the power voltage, wherein the first ring oscillator is similar or identical to the main ring oscillator, and wherein the first ring oscillator is coupled through the power mesh to the power voltage;

providing a second ring oscillator which is supplied by the power voltage, wherein the second ring oscillator is similar or identical to the main ring oscillator, and wherein the second ring oscillator is coupled through the power mesh to the power voltage;

using the first ring oscillator to calibrate a frequency of the output oscillation signal; and using the second ring oscillator to calibrate the frequency of the main ring oscillator.

13. The method as claimed in claim 12, wherein the power mesh has a resistance, and the frequency of the output oscillation signal is decreased because of the resistance of the power mesh.

14. The method as claimed in claim 13, wherein the frequency of the output oscillation signal is calibrated according to a first calibration data which is based on an oscillation frequency of the first ring oscillator.

15. The method as claimed in claim 14, wherein the first calibration data is obtained by selectively disabling and enabling the first ring oscillator.

16. The method as claimed in claim 15, wherein the first calibration data comprises a first frequency and a second frequency, the first frequency is the frequency of the output oscillation signal which is recorded when the first ring oscillator is disabled, and the second frequency is the frequency of the output oscillation signal which is recorded when the first ring oscillator is enabled.

17. The method as claimed in claim 16, further comprising:

performing a regression analysis for the first frequency and the second frequency so as to calculate a correct frequency of the output oscillation signal.

18. The method as claimed in claim 17 wherein the correct frequency is calculated as follows:

$$FC=2 \times F1-F2$$

wherein FC represents the correct frequency, F1 represents the first frequency, and F2 represents the second frequency.

19. The method as claimed in claim 12, wherein the main ring oscillator comprises:

an NAND gate, wherein the NAND gate has a first input terminal for receiving an enable signal, a second input terminal, and an output terminal;

a first inverter, wherein the first inverter has an input terminal coupled to the output terminal of the NAND gate, and an output terminal; and a second inverter, wherein the second inverter has an input terminal coupled to the output terminal of the first inverter, and an output terminal coupled to the second input terminal of the NAND gate;

wherein the output terminal of the second inverter is arranged for outputting the output oscillation signal.

20. The method as claimed in claim 13, wherein the resistance of the power mesh is from 100Ω to about 200Ω.

21. The method as claimed in claim 12, wherein the first ring oscillator comprises:

an NAND gate, wherein the NAND gate has a first input terminal for receiving a first control signal, a second input terminal, and an output terminal;

a first inverter, wherein the first inverter has an input terminal coupled to the output terminal of the NAND gate, and an output terminal; and a second inverter, wherein the second inverter has an input terminal coupled to the output terminal of the first inverter, and an output terminal coupled to the second input terminal of the NAND gate.

22. The method as claimed in claim 12, wherein the second ring oscillator comprises:

an NAND gate, wherein the NAND gate has a first input terminal for receiving a second control signal, a second input terminal, and an output terminal;

a first inverter, wherein the first inverter has an input terminal coupled to the output terminal of the NAND gate, and an output terminal; and a second inverter, wherein the second inverter has an input terminal coupled to the output terminal of the first inverter, and an output terminal coupled to the second input terminal of the NAND gate.

* * * * *